(12) United States Patent
Andrews

(10) Patent No.: US 8,610,134 B2
(45) Date of Patent: Dec. 17, 2013

(54) LED PACKAGE WITH FLEXIBLE POLYIMIDE CIRCUIT AND METHOD OF MANUFACTURING LED PACKAGE

(75) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 240 days.

(21) Appl. No.: 11/476,836

(22) Filed: Jun. 29, 2006

(65) Prior Publication Data
US 2008/0001160 A1 Jan. 3, 2008

(51) Int. Cl.
*H01L 33/00* (2010.01)
(52) U.S. Cl.
USPC .......... 257/81; 257/80; 257/84; 257/91; 257/95; 257/99
(58) Field of Classification Search
USPC ............ 313/511, 512; 257/13, 79–103, 918
See application file for complete search history.

(56) References Cited

U.S. PATENT DOCUMENTS

| | | | | |
|---|---|---|---|---|
| 4,774,434 A * | 9/1988 | Bennion | ............. | 313/500 |
| 4,963,425 A * | 10/1990 | Buchanan et al. | ............. | 428/212 |
| 5,319,243 A * | 6/1994 | Leicht et al. | ............. | 257/692 |
| 6,603,148 B1 * | 8/2003 | Sano et al. | ............. | 257/98 |
| 6,733,711 B2 * | 5/2004 | Durocher et al. | ............. | 264/272.14 |
| 6,936,855 B1 * | 8/2005 | Harrah | ............. | 257/88 |
| 7,576,496 B2 * | 8/2009 | Duggal et al. | ............. | 315/185 S |
| 7,633,093 B2 * | 12/2009 | Blonder et al. | ............. | 257/81 |
| 2004/0079957 A1 * | 4/2004 | Andrews et al. | ............. | 257/100 |
| 2005/0269587 A1 * | 12/2005 | Loh et al. | ............. | 257/99 |
| 2005/0280014 A1 * | 12/2005 | Park et al. | ............. | 257/98 |
| 2006/0110110 A1 * | 5/2006 | Yi et al. | ............. | 385/93 |

* cited by examiner

*Primary Examiner* — Ori Nadav
(74) *Attorney, Agent, or Firm* — Jenkins, Wilson, Taylor & Hunt, P.A.

(57) ABSTRACT

A light emitting diode (LED) package may include a base, at least one light emitting die on the base, and a flextape on the base. The flextape includes at least one metal trace connected to the light emitting die. In a method of manufacturing the LED package, the base may be formed so as to include a basin and at least one light emitting die may be placed within the basin. The flextape may be provided to include at least one metal trace that is electrically connected to the light emitting die.

18 Claims, 12 Drawing Sheets

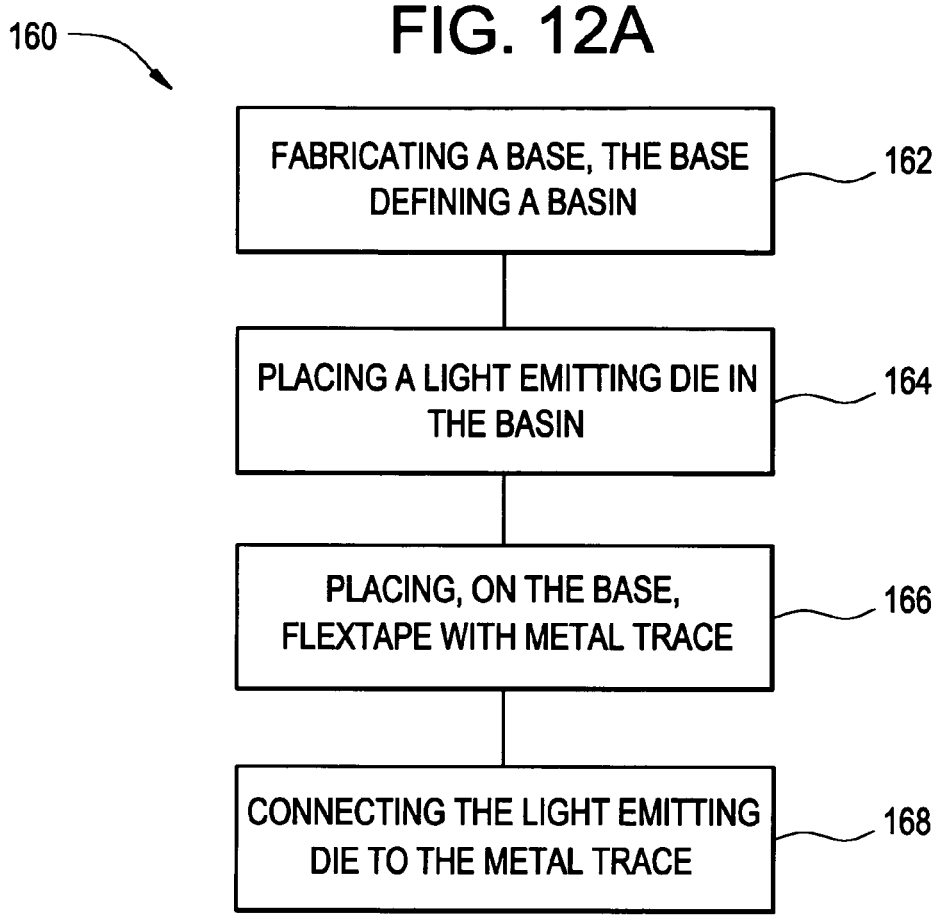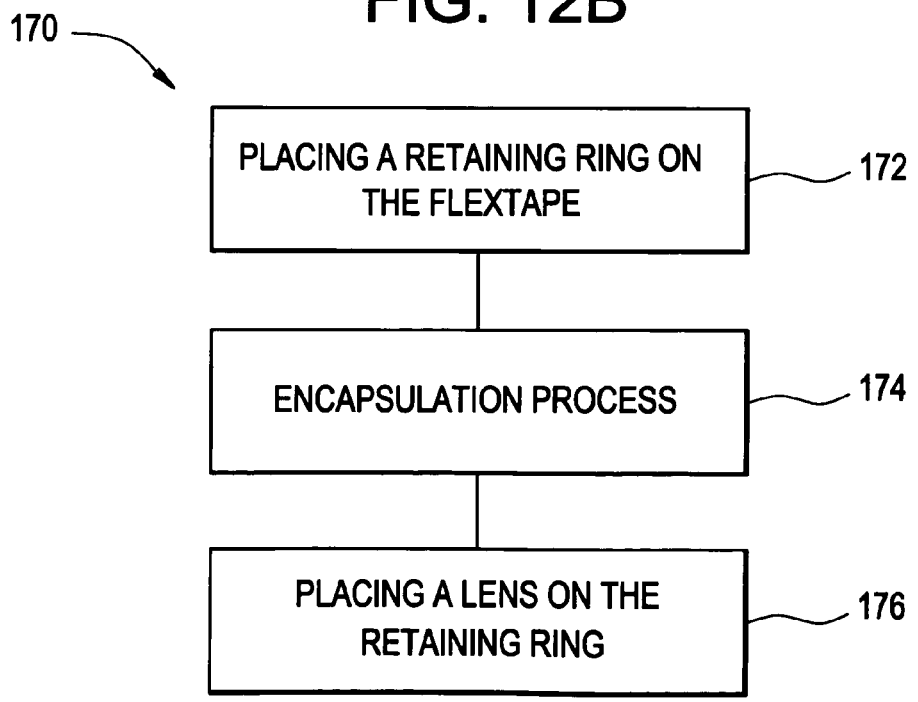

LED PACKAGE WITH FLEXIBLE POLYIMIDE CIRCUIT AND METHOD OF MANUFACTURING LED PACKAGE

BACKGROUND OF THE INVENTION

1. Field of the Invention

Example embodiments of the present invention, in general, relate to a light emitting diode (LED) package with a flexible polyimide circuit, and to a method of manufacturing an LED package.

2. Description of the Related Art

Light emitting diodes (LEDs) are widely used in consumer applications. In consumer applications, one or more LED dies (or chips) are mounted within a LED package. The package includes a packaging material with metal leads (to the LED dies from outside circuits), a protective housing for the LED dies, a heat sink, or a combination of leads, housing and heat sink. Various implementations of the LED packages are available in the marketplace to fill a wide range of applications.

For example, there is an expanding demand in the marketplace for the use of high-intensity LEDs in various applications. High intensity LEDs generate more light by operating at higher electrical power. However, high intensity LEDs generate more heat that needs to be dissipated. In addition, there exists a continuing demand in the marketplace to reduce the cost of producing these high intensity LEDs.

SUMMARY OF THE INVENTION

An example embodiment of the present invention is directed to a light emitting diode (LED) package. The package includes a base, at least one light emitting die on the base, and a flextape on the base. The flextape includes at least one metal trace connected to the light emitting die.

Another example embodiment of the present invention is directed to a method of manufacturing an LED package. In the method, a base may be formed so as to include a basin and at least one light emitting die may be placed within the basin. A flextape may be provided to include at least one metal trace that is electrically connected to the light emitting die.

BRIEF DESCRIPTION OF THE DRAWINGS

Exemplary embodiments of the present invention will become more fully understood from the detailed description given herein below and the accompanying drawings, wherein like elements are represented by like reference numerals, which are given by way of illustration only and thus are not limitative of the exemplary embodiments of the present invention.

FIGS. 12A and 12B are flowcharts illustrating a method of manufacturing a LED package according to an exemplary embodiment of the present invention.

DETAILED DESCRIPTION OF THE EXEMPLARY EMBODIMENTS

As used herein, the term "lens" may be understood as a device for either concentrating or diverging light, typically formed from a piece of shaped glass, polymer or plastic. For example, a lens as described herein may be embodied as a generally semi-spherical piece of shaped glass, polymer or plastic for concentrating or diverging light emitted from a light emitting die or LED assembly. A "flextape" as used herein may be understood as a polymer like film which in one high temperature example may be composed of a polyimide, i.e., a flexible polyimide circuit having at least one polyimide layer and at least one conductive layer within a flexible plastic resin. The conductive layer forms a metal trace connected to a light emitting die or LED assembly.

Example embodiments illustrating various aspects of the present invention will now be described with reference to the figures. As illustrated in the figures, sizes of structures and/or portions of structures may be exaggerated relative to other structures or portions for illustrative purposes only and thus are provided merely to illustrate general structures in accordance with the example embodiments of the present invention.

Furthermore, various aspects of the example embodiments may be described with reference to a structure or a portion being formed on other structures, portions, or both. For example, a reference to a structure being formed "on" or "above" another structure or portion contemplates that additional structures, portions or both may intervene there between. References to a structure or a portion being formed "on" another structure or portion without an intervening structure or portion may be described herein as being formed "directly on" the structure or portion.

Additionally, relative terms such as "on" or "above" are used to describe one structure's or portion's relationship to another structure or portion as illustrated in the figures. Further, relative terms such as "on" or "above" are intended to encompass different orientations of the device in addition to the orientation depicted in the figures. For example, if a device or assembly in the figures is turned over, a structure or portion described as "above" other structures or portions would be oriented "below" the other structures or portions. Likewise, if a device or assembly in the figures is rotated along an axis, a structure or portion described as "above" other structures or portions would be oriented "next to", "left of" or "right of" the other structures or portions.

Figure 1A:
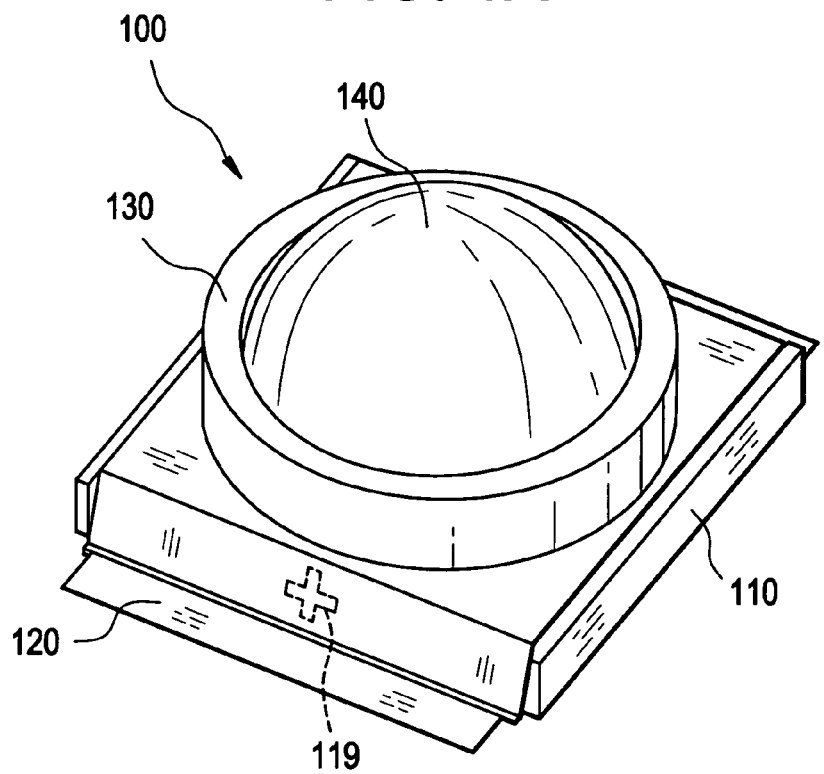
FIG. 1A illustrates a perspective view of a LED package in accordance with an exemplary embodiment of the present invention.
Figure 1B:
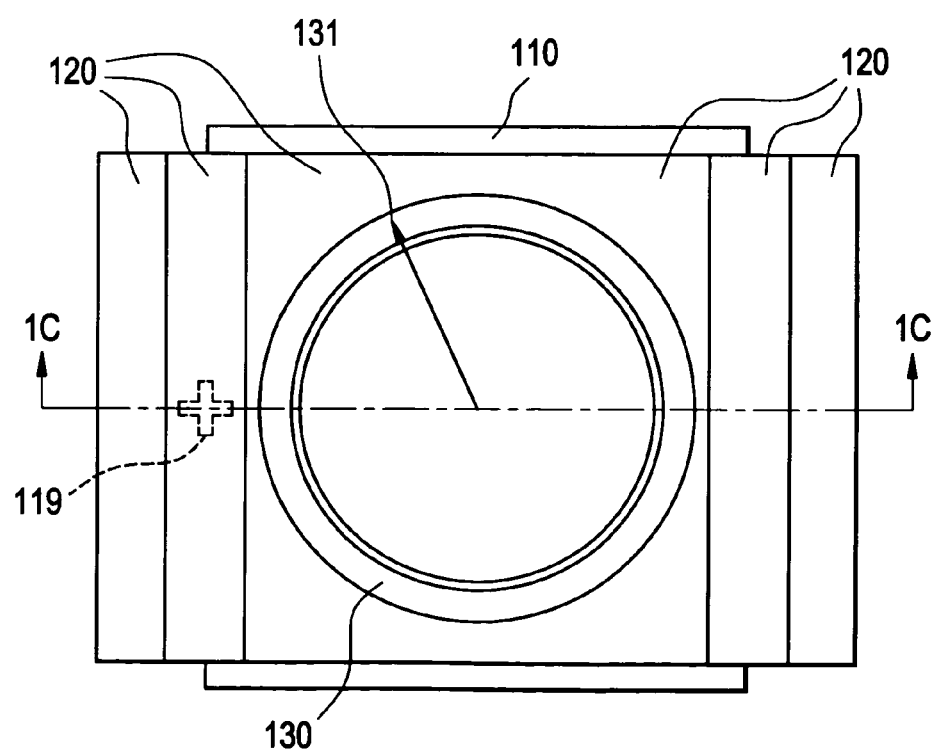
FIG. 1B illustrates a top view of FIG. 1A.
Figure 1C:
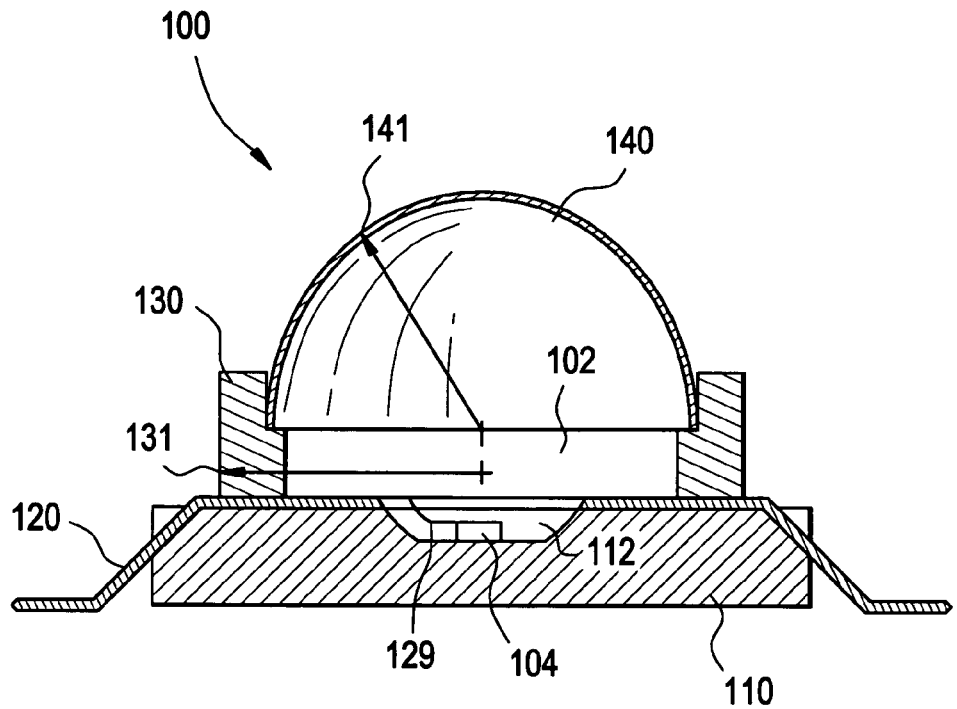
FIG. 1C illustrates a cutaway side view of FIG. 1A.

FIG. 1A illustrates a perspective view of an LED package in accordance with an exemplary embodiment of the present invention, FIG. 1B illustrates a top view of FIG. 1A and FIG. 1C illustrates a cutaway side view of FIG. 1A taken along line 1C-1C of FIG. 1B. Referring to FIGS. 1A through 1C, a light emitting diode (LED) package 100 includes a base 110 defining a basin 112. At least one light emitting die 104 is placed within the basin 112. A flextape 120 including at least one metal trace is provided on the base 110 and electrically connected to a light emitting die 104. Although shown generally in FIGS. 1A-1C as one circuit (for convenience of explanation), flextape 120 may be composed of a number of complex integrated circuits and leads/metal traces on top of base 110.

The package 100 is a discrete unit which can be fabricated in a continuous or batch process. Electrical and thermal properties are contained within the package 100. In other words, package 100 provides both an electrical isolation and a thermal conduction function for the LED chip or die 104 therein. In an example, the package 100 may be referred to as a surface mount type (SMT) device.

Figure 13A:
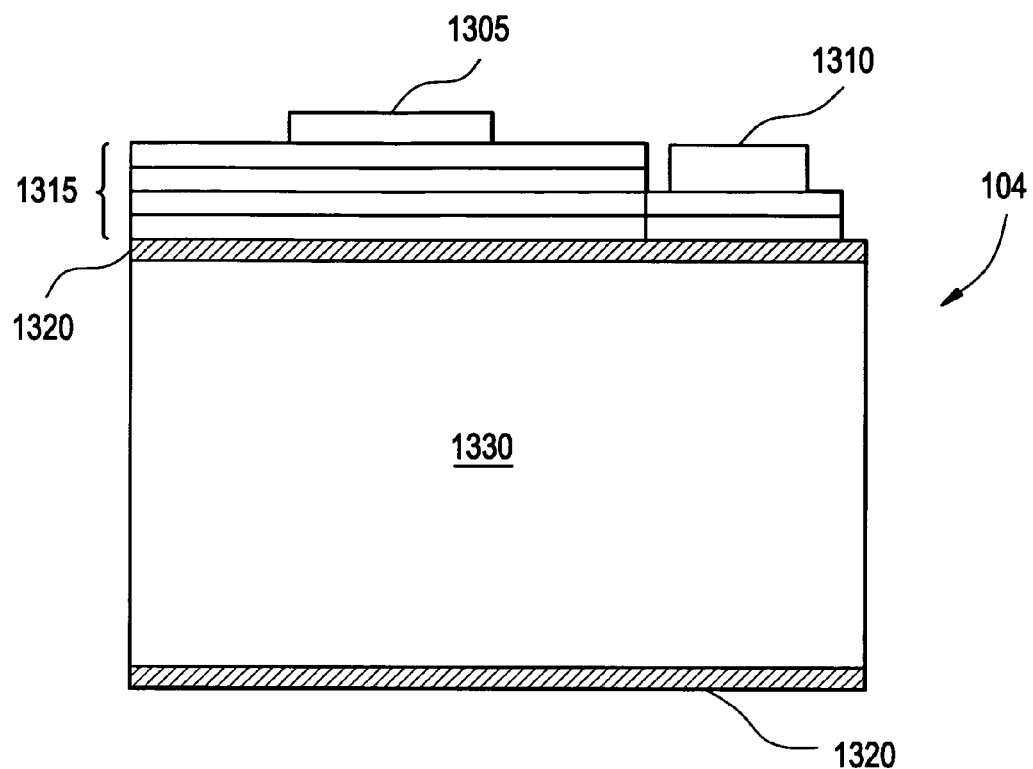
FIGS. 13A and 13B illustrate die cross-sections to illustrate example orientations of electrodes on the light-emitting die according to an exemplary embodiment of the present invention.
Figure 13B:
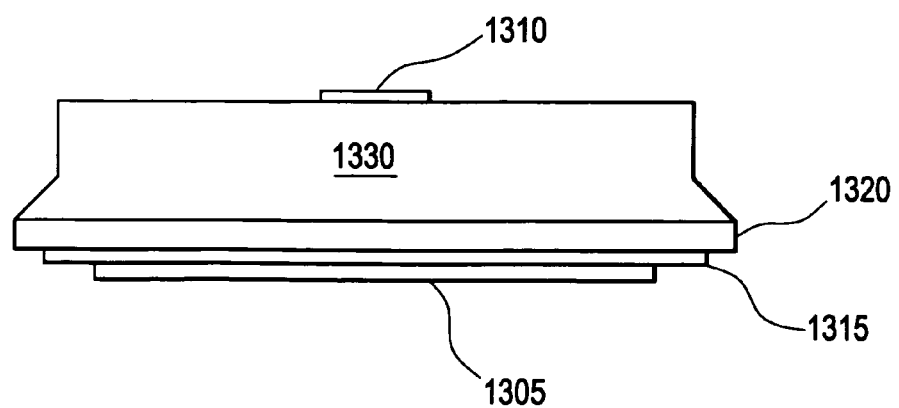

FIGS. 13A and 13B illustrate die cross-sections to illustrate example orientations of electrodes on the light-emitting die according to an exemplary embodiment of the present invention. The light-emitting die 104 may be oriented in a planar configuration with "same-side-electronics", in which the electrodes are provided on the same side of the die 104, or in a vertical orientation in which there are "vertical structure" electrodes. FIGS. 13A and 13B illustrate these two orientations.

FIG. 13A shows an LED chip or die 104 with an anode 1305 and cathode 1310 on the same side of the LED chip 104. FIG. 13A thus illustrates one example chip orientation, shown as a surface-emitting AlGaInP multiquantum-well (MQW) and double heterostructure (DH) layer structure 1315 that is bonded with a metal reflector 1320 on a substrate 1330. FIG. 13B show the anode 1305 and cathode 1310 on opposite sides of the substrate 1330 with a metal reflector 1320 and an example InGaN chip layer 1315.

The orientations shown in FIGS. 13A and 13B for light-emitting die (LED chip) 104 therefore illustrate industry standard parts that highlight the concept of "same-side" electrodes and "vertical-structure" electrodes. Either die 104 arrangement can be flipped for connection changes.

A retaining ring 130 is arranged to be adhered to or fastened to the flextape 120 and/or base 110. As example fastening means, retaining ring 130 may be glued via an epoxy, potted, bonded with a plastic and/or formed as a plastic or ceramic mold to base 110. In one example, the retaining ring 130 may be adhered to the base 110 with an adhesive.

The retaining ring 130 may serve several functions, including but not limited to mechanical protection for the light-emitting die 104 and wirebond 129, a shape for encapsulant as a container, a lens 140 retention mechanism, as the ring 130 provides a side load on the lens 140, and a lens 140 positioning function. In the latter function, the ring 130 enables the lens 140 to float so as to accommodate expansion or shrinkage of the lens 140 for varying temperatures. This function is described in more detail in co-pending and commonly-assigned U.S. patent application Ser. No. 11/044,126, filed Jan. 27, 2005 to Peter Andrews et al. and entitled "Methods for Packaging a Light Emitting Device and Packaged Light Emitting Devices", the relevant portions describing the floating aspect of the retaining ring incorporated by reference herein.

The retaining ring 130 is arranged above the basin 112 so as to substantially encircle the basin 112. In one example, a lens 140 is placed on the retaining ring 130. In the figures, the lens 140 is shown as having a generally semi-spherical upper configuration which tapers into a generally planar, horizontal bottom surface that rests on a ledge of retaining ring 130, as shown in the side view of FIG. 1C for example. However, it is evident to one skilled in the art that lens 140 could have another shape for either concentrating or diverging light. For example, the lens 140 could be arranged so as to extend below light emitting die 104 so as to center the emitting part of die 104 in the center of a hemispherical lens 140 shape (i.e., the chip of die 104 sits up in the lens 140, with a portion of lens 140 extending below the chip surface). The base 110, retaining ring 130 and lens 140 may collectively define an enclosed cavity 102 which encompasses basin 112 and the space within the basin 112.

Figure 2A:
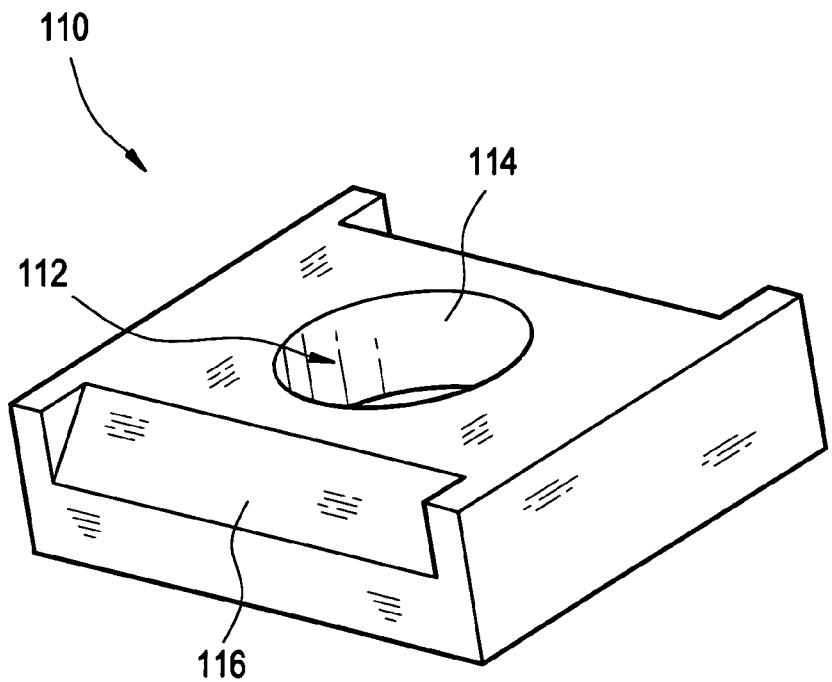
FIG. 2A illustrates a perspective view of a portion of the LED package of FIG. 1A.
Figure 2B:
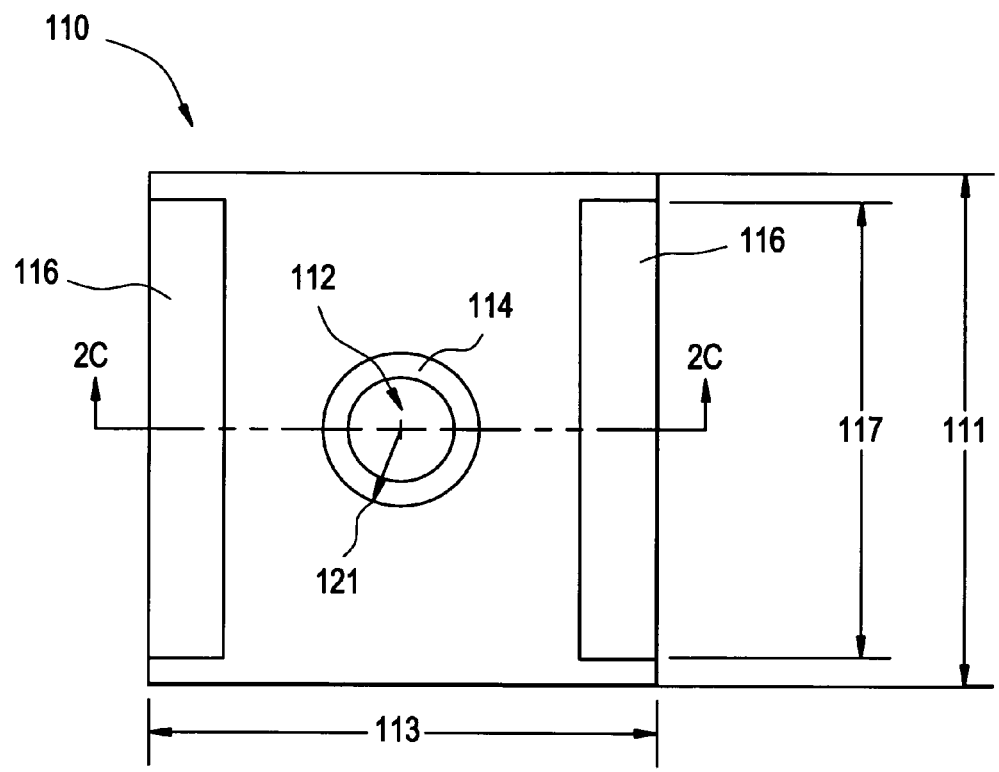
FIG. 2B illustrates a top view of the portion illustrated in FIG. 2A.
Figure 2C:
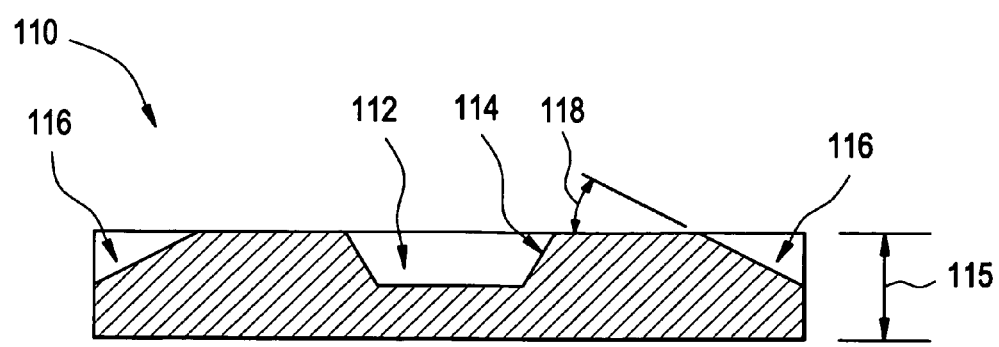
FIG. 2C illustrates a cutaway side view of the portion illustrated in FIG. 2A cut along line 2C-2C of FIG. 2B.

FIG. 2A illustrates a perspective view of a portion of the LED package 100 of FIG. 1A, FIG. 2B illustrates a top view of the portion illustrated in FIG. 2A and FIG. 2C illustrates a cutaway side view of the portion illustrated in FIG. 2A, as cut along line 2C-2C of FIG. 2B. Referring to FIGS. 1A through 2C, the base 110 can be composed of a metal or other thermally conductive material (for example, any metal or metal alloy, or non-metal conductors such as AlN, $Al_2O_3$) for removing or "sinking" heat from the light emitting die 104. For this reason, the base 110 may also be referred to as a heat sink.

The base 110 can be formed to various sizes depending on the desired application for the LED package 100. For the illustrated example embodiment only, the base 110 may have a width dimension of 4.5 mm, a length dimension 113 of 5 mm, and a height dimension 115 of 1.05 mm, it being understood that these dimensions may be smaller or larger for a given application. The die 104 is encompassed within the basin 112. The basin 112 has basin surfaces 114, which in FIG. 2C are shown as inclined, angled surfaces 114. The basin surfaces 114 may include an optical finish to reflect light from the light emitting die 104. Dimensions of the basin 112 may vary depending in a number of factors including, for example, the dimensions of the base 110, size of the die 104, etc. As shown best in FIG. 2B, in one example the basin 112 may have an outer radius 121 of approximately 1.0 mm.

The base 110 may include chamfers 116 proximal to its edges. The chamfers 116 may be formed to any desired width to accommodate the flextape 120. With the chamfers 116, as the flextape 120 is placed on the base 110, an angle 118 at which the flextape is bent is less than ninety degrees. This angle may be set to a desired inclination (based on a given application) so as to reduce mechanical stresses on the flextape 120, which may thus increase the reliability of the flextape 120. In one example, the angle 118 may be 52.5 degrees. Each chamfer 116 may have a width 117 that is less than the length 113 of the base 110 such as, for example, 4.25 mm. Accordingly, the flextape 120 may be attached to the package 100 via chamfers 116 or slits formed in base 110. This width 117 may be varied so as to accommodate a given flextape 120.

The base 110 can be processed and treated using a number of techniques such as an electrolytic plating process, for example. The base 110 can be processed as an under layer or a pure Nickel layer by using a sulfate Nickel solution, so as to achieve a plate thickness of the base 110 in a range of about 100 to 200 μin. Then, a finish layer of pure silver can be formed using a silver cyanide solution that is free of an organic or inorganic brightener such as Antimony, so that the resultant plate thickness of base 110 is between about 100-200 μin.

Figure 3A:
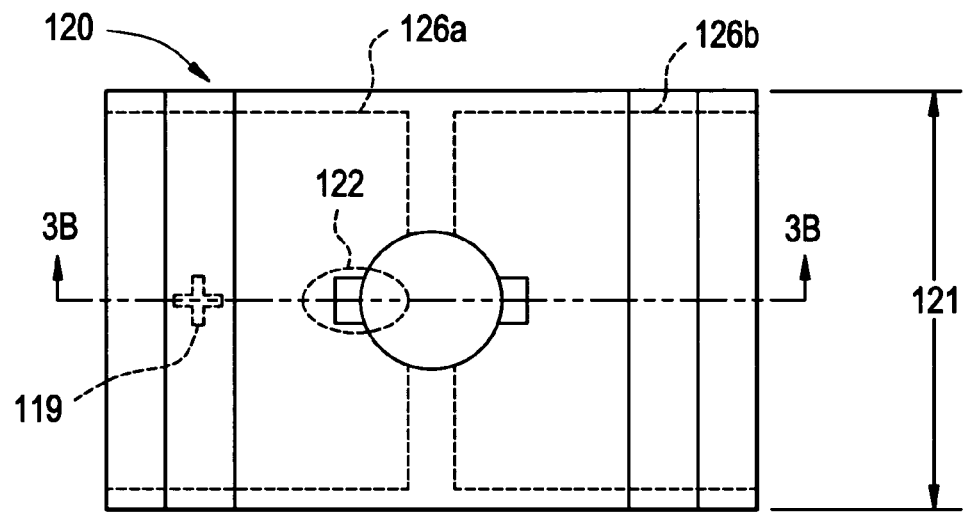
FIG. 3A illustrates a top view of another portion of the LED package of FIG. 1A.
Figure 3B:
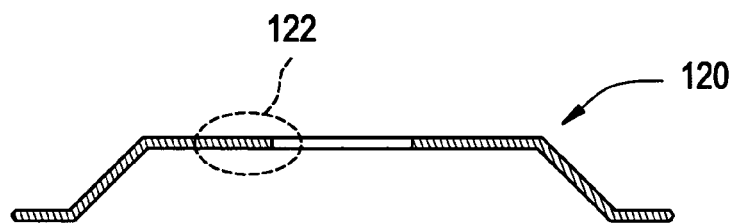
FIG. 3B illustrates a cutaway side view of the portion illustrated in FIG. 3A cut along line 3B-3B.
Figure 3C:
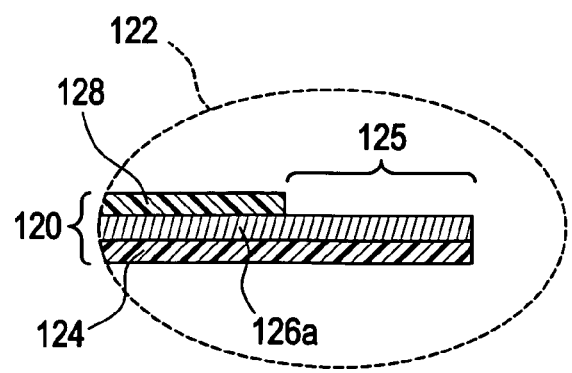
FIG. 3C illustrates a more detailed view of the portion shown in FIG. 3B.

FIG. 3A illustrates a top view of another portion 122 of the LED package of FIG. 1A, illustrating flextape 120 of FIG. 1A in more detail. FIG. 3B illustrates a cutaway side view of the flextape 120 in FIG. 3A cut along line 3B-3B, and FIG. 3C illustrates a more detailed view of the portion 122 of the flextape 120 and a portion of bond wire 129 (see also FIG. 1C) electrically connecting the flextape 120 to the light emitting die 104.

Referring to FIGS. 1A through 3C, the flextape 120 may include multiple layers. The layers may include a polyimide layer 124 of flexible plastic resin. Polyimide material is a synthetic polymeric resin of a class that is resistant to high temperatures, wear and corrosion. Polyimide materials have been used primarily as a coating or film on a substrate substance and are electrically insulating materials.

The flextape 120 also includes a metal conductive layer 126*a*, 126*b*, also referred to as a metal trace 126*a*, 126*b* for electrical connection. In the illustrated embodiment, a second polyimid layer 128 is shown, so as to sandwich conductive layer 126*a*, 126*b* between the two polyimid layers 124 and 128. As shown best in FIG. 3A, the conductive layer 126*a*, 126*b* forms two metal traces 126*a* and 126*b*. The desired polarity of the metal trace 126*a*, 126*b* can be marked using a polarity mark 119. The metal trace 126*a*, 126*b* may be formed of copper, silver, alloys thereof of copper or silver or other metal materials having high electrical conduction properties. As shown in FIG. 3C, an exposed portion 125 of the flextape 120 may be coated with SnPb or Pb to facilitate soldering of the bond wire 129 to the flextape 120. A high temperature solder such as Sn, AgSn, AuSn, etc. may be used as the soldering agent, for example. Another way to connect the flextape 120 may be by wirebonding.

The LED package 100 includes the retaining ring 130 placed on the flextape 120 and positioned above the basin 112 so as to encircle the basin 112. The retaining ring 130 may be composed of a thermally conductive material such as metal, ceramic or plastic. In one example, the retaining ring 130 may have a generally cylindrical shape with an inner flange or ledge to accommodate the placement of the lens 140 thereon. Dimensions of the retaining ring 130 may vary widely depending on the desired application. In one example, the retaining ring 130 may have an outer diameter radius 131 of about 3.1 mm.

The lens 140 may be composed of a clear polymer, plastic or glass suitable to conduct and direct light from the light emitting die 104. As shown, lens 140 has a generally semi-spherical shape, but the shape may be different for different applications.

The cavity 102 is a space enclosed by the base 110, retaining ring 130 and lens 140. The cavity 102 encompasses the space within the basin 112. In one example, the cavity 102 may be filled with an encapsulant material such as clear epoxy, silicon, or a combination of epoxy and silicon, for example. In an example, the encapsulant may have an optical index that matches the optical index of the lens 140. Depending on the desired implementation, as the lens 140 is placed on the retaining ring 130, the lens 140 may be in contact with the retaining ring 130, or the lens 140 may be floating on the encapsulant and not in contact with the retaining ring 130.

Figure 4:
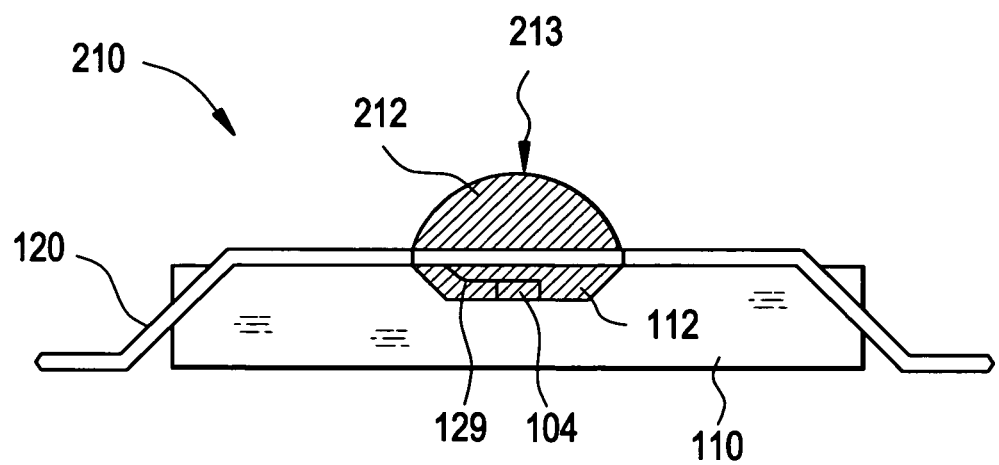
FIG. 4 illustrates a side view of a LED package according to another exemplary embodiment of the present invention.

FIG. 4 illustrates a side view of a LED package 210 according to another exemplary embodiment of the present invention. Portions of the LED package 210 are similar to corresponding portions of the LED package 100 in FIGS. 1A-3C, and thus are assigned the same reference numerals. A detailed explanation of common components are omitted for purposes of brevity; only those features differing from that previously explained are described in detail in FIG. 4.

Referring to FIG. 4, the basin 112 of base 110 is filled with an index matching encapsulant 212 encapsulating the light emitting die 104. In FIG. 4, the encapsulant 212 is illustrated using a transparent hatched area. This is for clarity of the illustration only. The index matching encapsulant 212 can be formed having a curved top outer surface 213, for example. The encapsulant 212 can be formulated to different degrees of hardness by performing multiple curing processes. In an example, the encapsulant 212 can be formulating through several curing processes to form a hard outer surface (top outer surface 213) while the remainder of the encapsulant 212 within, e.g., the core, remains softer. In this example, one material formulation may be used for the outer surface 213, while another, different material formulation may be used for the softer encapsulant in the core.

Figure 5:
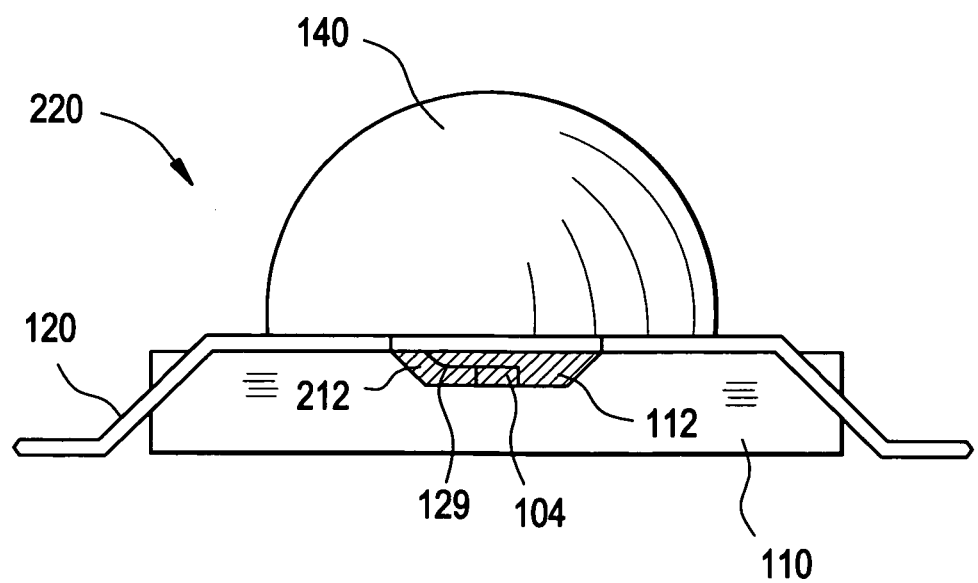
FIG. 5 illustrates a side view of a LED package according to another exemplary embodiment of the present invention.

FIG. 5 illustrates a side view of a LED package according to another exemplary embodiment of the present invention. Portions of the LED package 220 are similar to corresponding portions of the LED package 100 in FIGS. 1A-3C or LED package 210 in FIG. 4, and thus are assigned the same reference numerals. A detailed explanation of common components are omitted for purposes of brevity; only those features differing from that previously explained are described in detail in FIG. 5.

Referring to FIG. 5, the base 110 of LED package 220 defines the basin 112 which is filled with an index matching encapsulant 212 (shown by hatching) encapsulating the light emitting die 104. In FIG. 5, a lens 140 may be placed on the base 110 and directly on the encapsulant 212 which fills the basin 112. The lens can be any shape as needed for optics, however semi-hemispherical is common.

Accordingly, no retaining ring 130 is employed in this example; the lens 140 may be built onto and fixedly attached to base 110 via lens material 212. In one example, the lens may be formed by an encapsulating material.

If the lens is dispensed, then an encapsulating material is used and the lens shape is formed by retarding the spread of the encapsulant and controlling the volume to form a dome and then curing the encapsulant. This shape control is may use the meniscus forming properties of the encapsulating material by designing meniscus holding features or altering surface energies to enhance the surface tension characteristics. If the lens is molded, in one example the part is transferred into a mold and the lens material injected into a cavity, or the mold can be brought to the part and material injected. Molding is a common method of shaping plastic, silicones, glass, etc.

Figure 6:
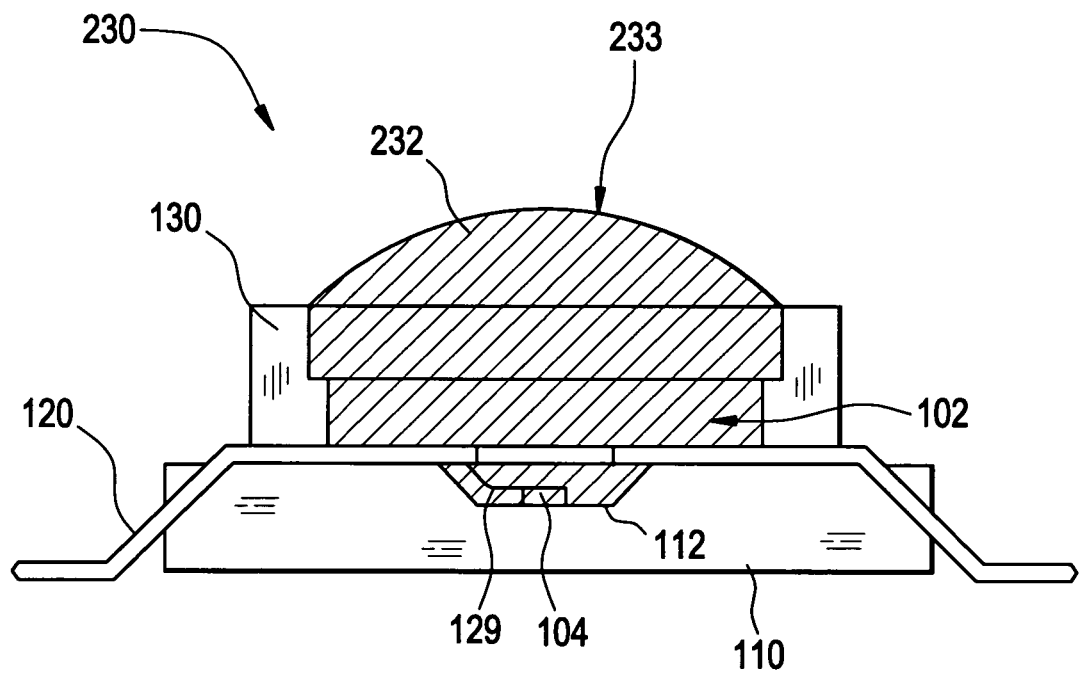
FIG. 6 illustrates a side view of a LED package according to another exemplary embodiment of the present invention.

FIG. 6 illustrates a side view of a LED package according to another exemplary embodiment of the present invention. Portions of the LED package 230 are similar to corresponding portions of the LED package 100 in FIGS. 1A-3C or LED package 210 in FIG. 4, and thus are assigned the same reference numerals. A detailed explanation of common components are omitted for purposes of brevity; only those features differing from that previously explained are described in detail in FIG. 6.

Referring to FIG. 6, the LED package 230 includes the retaining ring 130, which is placed on the flextape 120 and encircles space or cavity 102 above the light emitting die 104. The cavity 102 is the space enclosed by the base 110, retaining ring 130 and lens 140, as previously described, and which encompasses the space within the basin 112.

An encapsulant 232 encapsulates the light emitting die 104 and at least partially fills the space encircled by the retaining ring 130.

In one example, the encapsulant 232 completely fills the cavity 102 encircled by the retaining ring 130, as well as the basin 112 and interior space within lens 140. The encapsulant 232 includes a generally semi-spherical outer top surface 233, and illustrated by a mostly transparent hatched area. This is for clarity of the illustration only. Similar to the encapsulant 212 of FIG. 4 the encapsulant 232 can be formulated to different degrees of hardness via several curing processes of different material formulations.

Figure 7:
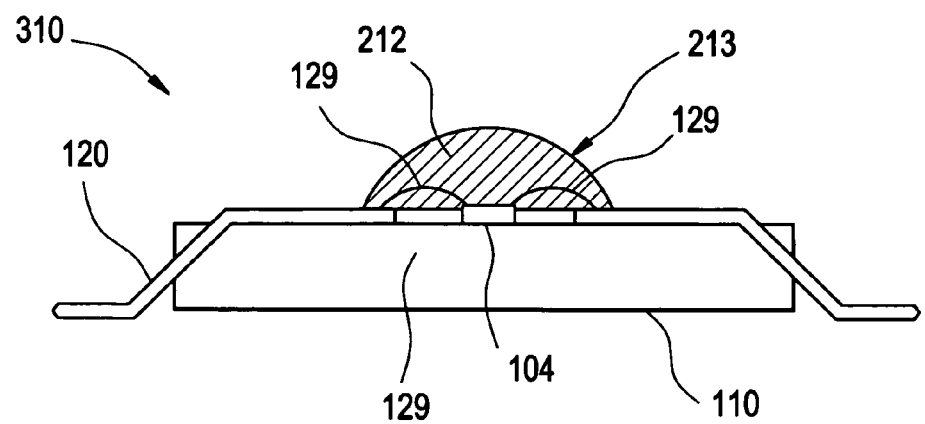
FIG. 7 illustrates a side view of a LED package according to another exemplary embodiment of the present invention.

FIG. 7 illustrates a side view of a LED package according to another exemplary embodiment of the present invention. Portions of the LED package 310 are similar to corresponding portions of the LED package 100 in FIGS. 1A-3C or LED package 210 in FIG. 4, and thus are assigned the same reference numerals. A detailed explanation of common components are omitted for purposes of brevity; only those features differing from that previously explained are described in detail in FIG. 7.

Referring to FIG. 7, the base 110 of LED package 220 defines the surface on which is placed light emitting die 104. Unlike the previous figures, no basin 112 is formed in base 110. Instead, an index matching encapsulant 212 (shown by hashing) is formed directly over base 110, die 104 and flextape 120 so as to encapsulant the light emitting die 104. In FIG. 7, the encapsulant itself represents the lens. Accordingly, no retaining ring 130 or lens 140 is employed in this example. Further, two bonding wires 129 may be used, each connected to a separate positive or negative trace 126a, 126b of flextape 120.

As in FIG. 4, the index matching encapsulant 212 can be formed having a curved top outer surface 213, and can be formulated to different degrees of hardness, i.e., using different material formulations. In an example, the encapsulant 212 can be cured in one material formulation to form a hard outer surface (top outer surface 213) while the remainder of the encapsulant 212 within, e.g., the core, may be formed and then cured using another material to remain softer.

Figure 8:
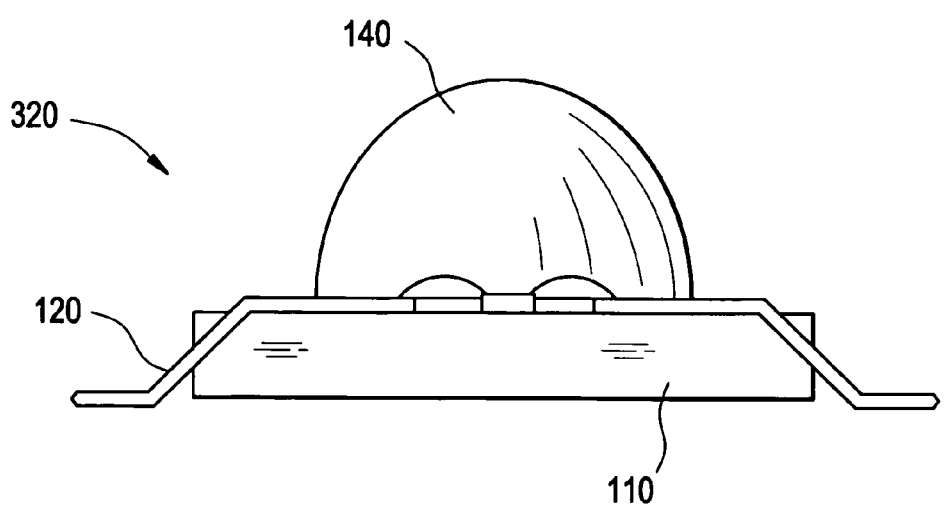
FIG. 8 illustrates a side view of a LED package according to another exemplary embodiment of the present invention.

FIG. 8 illustrates a side view of a LED package according to another exemplary embodiment of the present invention. Portions of the LED package 320 are similar to corresponding portions of the LED package 100 in FIGS. 1A-3C or LED package 310 in FIG. 7, and thus are assigned the same reference numerals. A detailed explanation of common components are omitted for purposes of brevity; only those features differing from that previously explained are described in detail in FIG. 8.

Figure 9:
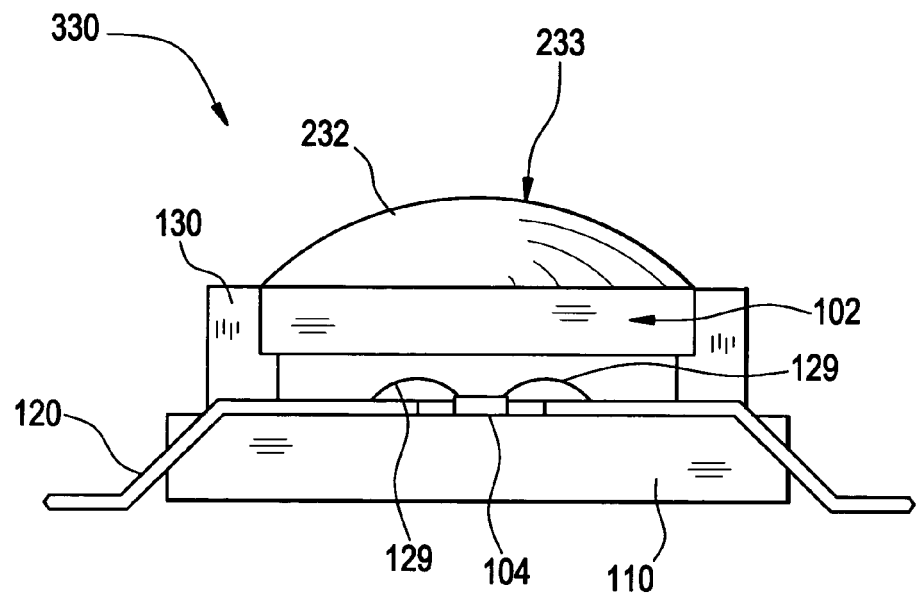
FIG. 9 illustrates a side view of an LED package according to another exemplary embodiment of the present invention.

Referring to FIG. 8, the base 110 of LED package 320 defines the surface on which is placed light emitting die 104. Unlike the previous figures, no basin 112 is formed in base 110. Instead, and as described in FIG. 5, an index matching encapsulant 212 may be formed directly over base 110, die 104 and flextape 120 so as to encapsulant the light emitting die 104. In FIG. 8, a lens 140 may be placed on the base 110 and directly on the encapsulant 212 which encapsulated die 104. This lens may be designed such that a hollow exists in the lens to allow for the features of the die and wirebonds. Accordingly, no retaining ring 130 is employed in this example; the lens 140 may be fixedly attached to base 110 via encapsulant 212 in one example, or formed by the encapsulanting material by potting or molding. FIG. 9 illustrates a side view of an LED package according to another exemplary embodiment of the present invention. Portions of the LED package 330 are similar to corresponding portions of the LED package 100 in FIGS. 1A-3C, LED package 210 in FIG. 4 or LED package 230 of FIG. 6, and thus are assigned the same reference numerals. A detailed explanation of common components are omitted for purposes of brevity; only those features differing from that previously explained are described in detail in FIG. 9.

Referring to FIG. 9, the LED package 330 includes the retaining ring 130, which is placed on the flextape 120 and encircles space or cavity 102 above the light emitting die 104. The cavity 102 is the space enclosed by the base 110, retaining ring 130 and lens 140, as previously described. However, no basin 112 is formed in base 110. Further, two bonding wires 129 may be used, each connected to a separate positive or negative trace 126a, 126b of flextape 120.

FIG. 9 is this similar to FIG. 1C, but uses two bonding wires 129 and no basin 112. Further, an encapsulant 232 as described in FIG. 6 may be used to encapsulate the light emitting die 104 and partially fill the space encircled by the retaining ring 130. In one example, the encapsulant 232 completely fills the cavity 102 encircled by the retaining ring 130 and interior space within lens 140. The encapsulant 232 could include a generally semi-spherical outer top surface 233, as shown in FIG. 6. In this variant, and as initially described in FIG. 4, encapsulant 232 can be formulated to cure at different degrees of hardness.

Figure 10:
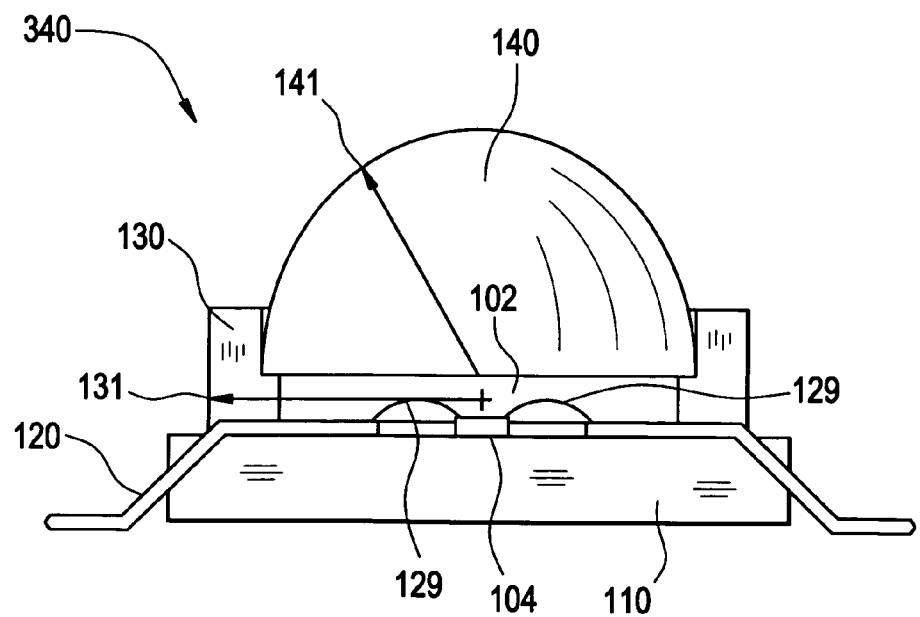
FIG. 10 illustrates a side view of a LED package according to another exemplary embodiment of the present invention.

FIG. 10 illustrates a side view of a LED package according to another exemplary embodiment of the present invention. Referring to FIG. 10, the LED package 340 includes the retaining ring 130, which is placed on the flextape 120 and encircles space or cavity 102 above the light emitting die 104. No basin 112 is formed in base 110, and two bonding wires 129 may be used, each connected to a separate positive or negative trace 126a, 126b of flextape 120. FIG. 10 thus illustrates an embodiment somewhat similar to FIG. 1C in which an encapsulant may not be used, but differs from FIG. 1C in that two bonding wires 129 are used and no basin 112 is formed in base 110.

Figure 11:
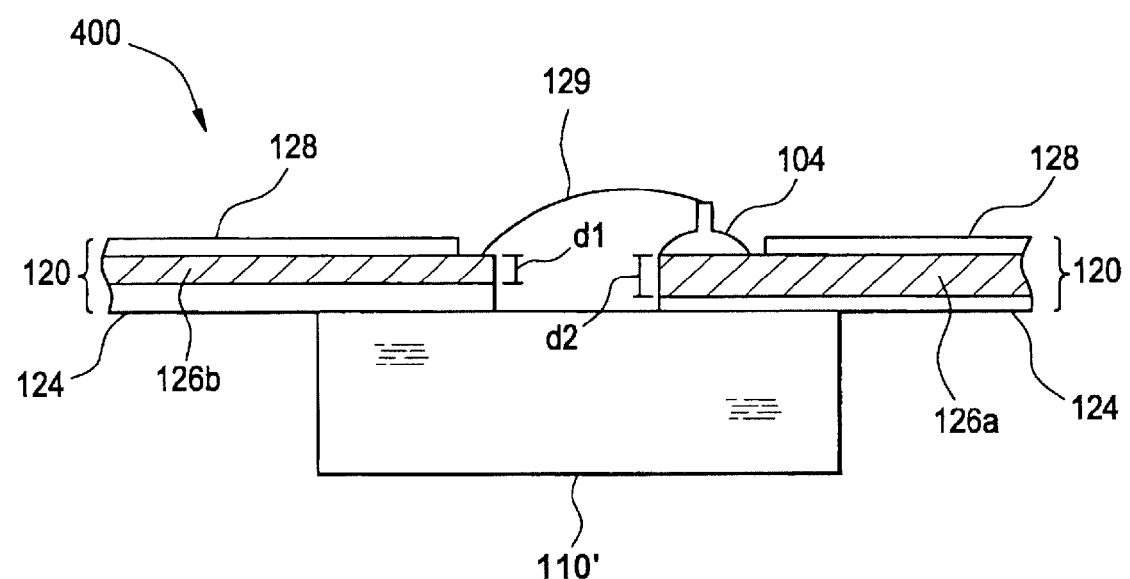
FIG. 11 illustrates a side view of a LED package according to another exemplary embodiment of the present invention.

FIG. 11 illustrates a side view of a LED package according to another exemplary embodiment of the present invention. Referring to FIG. 11 the LED package 400 includes no basin 112 and includes a single bonding wire 129 (cathode or anode). In FIG. 11, the polyimid layers 124 and 128 and intervening metal conductive layer 126a, 126b comprising the flex tape 120 are shown in more detail. Part of polyimid layer 128 has been removed so to expose metal traces 126a and 126b. In FIG. 11, the light emitting die 104 resides on an elevated surface of flex tape 120. For example, metal trace 126a may be fabricated so as to be thicker than metal trace 126b, as shown by distances d1 and d2 from the surface of a metal base 110'. Alternatively, the die 104 could be placed on the lower trace 126b, with bonding wire 120 electrically connected to trace 126a. In another example, base 110 could be grooved or recessed so that the flextape 120 sits flush with the top surface of base 110. FIG. 11, the light emitting die 104 resides on an elevated surface of flex tape 120. For example, metal trace 126a may be fabricated so as to be thicker than metal trace 126b, as shown by distances d1 and d2 from the surface of a metal base 110'. Alternatively, the die 104 could be placed on the lower trace 126b, with bonding wire 120 electrically connected to trace 126a. In another example, base 110 could be grooved or recessed so that the flextape 120 sits flush with the top surface of base 110.

In FIG. 11, metal base 110' is not necessary part of LED package 400. This allows a low-cost-light-weight light emitting component to be placed directly on a Printed Circuit Board or Metal-Core-PCB. Also because the configuration of FIG. 11 enables the ability to mass produce a number of dies 104 on a continuous stretch of flex tape 120, for application to any desired metal structure which may act as the anode, cathode or neutral wire for electrical conduction and as a heat sink (neutral) to remove heat from die 104. Thus, package 400 could be used in a lighting application where it is desired to wrap a continuous reel of flex tape with a plurality of dies 104 along a bridge span, on a vertical metal pole, etc., so as to provide lighting for a given application.

FIGS. 12A and 12B are flowcharts illustrating a method of manufacturing a LED package according to an exemplary embodiment of the present invention. Referring to FIG. 12A, in a given method 160, in this example for fabricating a portion of an LED package or LED subassembly for an LED package 100 as shown in FIGS. 1A-3C, for example, a base 110 may be formed (162) using a thermally conductive material so as to define a basin 112. One or more light emitting die's 104 may be placed (164) within the basin 112. A flextape 120 is placed (166) on the base 110. The flextape 120 can include one or more metal traces 126a, 126b, depending on the application. The metal trace(s) 126a, 126b may be electrically connected (168) to the die 104 by a bond wire 129, for example.

Referring to sub-process 170 in FIG. 12B, to manufacture a complete LED package 100, 210, 220, 230, etc., the retaining ring 130 may be placed (172) on the flextape 120 so that it is arranged above the basin 112 and encircles the basin 112. The cavity 102 may be filled (174) with an encapsulant (212/232, etc.) using a suitable encapsulation process (174). In an example, this may entail multiple filling and curing processes. The lens 140 is then placed (176) on the retaining ring 130. Step 176. Following the lens 140 attachment, further curing may be necessary for the encapsulant 212/232. Each of the process functions 172 through 176 can be practiced individually or in a given combination or given order to manufacture a given LED package 100, 210, 220, 230 as described above. For example, not all of the process functions need be performed to fabricate the LED packages as shown in any of FIGS. 7, 8 and 11.

Therefore, in one example embodiment as shown by FIGS. 1A-1C, an LED package 100 includes a base 110, at least one light emitting die 104, a flextape 120, a retaining ring 130 and a lens 140. In this example, the base 110 includes a basin 112 encompassing the die 104. The flextape 120 includes at least one metal trace connected to the light emitting die 104. The retaining ring 130 is on the flextape and positioned above so as to substantially encircle the basin 112. The lens 140 is positioned on the retaining ring 130. Accordingly, the base 110, retaining ring 130 and lens 140 may collectively define a cavity 102 which encompasses the basin 112.

The use of flextape may facilitate the manufacturing process as compared to conventional manufacturing techniques. The flextape do to its constituent component construction can withstand relatively high temperatures (i.e., 300° C.) without damage. Accordingly, during the manufacturing process, a high temperature solder (such as Sn, AgSn, AuSn, etc.) can be applied to the base 110, flextape 120, light emitting die 104, or to any combination of these components. Additionally, a metal base having markedly better heat transfer properties is used in lie of the conventional ceramic or plastic base.

Accordingly, in one example, the light emitting die 104 may be directly placed into the basin 112 of the metal base 110, or placed directly on a base 110 construction having no basin 112 formed therein. By forming a metal base 110 with a reflector-shaped basin 112 for a desired heat conduction and/or optical arrangement, desired thermal management characteristics and optical output reflection characteristics may be achievable. These designs may thus improve heat dissipation characteristics of a formed LED package. Moreover, the process for attaching constituent components of the package during manufacture may be relatively simple and quick and thus potentially less costly as compared to attachment techniques of prior art LED package designs.

As described with reference to FIG. 11, for example, the flextape may include multiple, intricate circuitry and metal trace patterns for applications where it may be desirable to use multiple light emitting dies (e.g., multiple colors such as Red, Green, and Blue). Furthermore, these complex patterns may be relatively easy and cost effective to implement using existing flextape techniques. A flextape having complex patterns may enable the manufacture of LED packages having sophisticated functions at a minimal increase in cost. This may be due in part to the fact that flextape may be manufactured in mass using a reel-to-reel production technique, for example.

As discussed above, the design of package 100 (which is an SMT device) permits both electrical and thermal properties to be contained within the package 100. In other words, the package 100 provides both an electrical isolation and a thermal conduction function for the LED chip or die 104 therein.

Figure 14A:
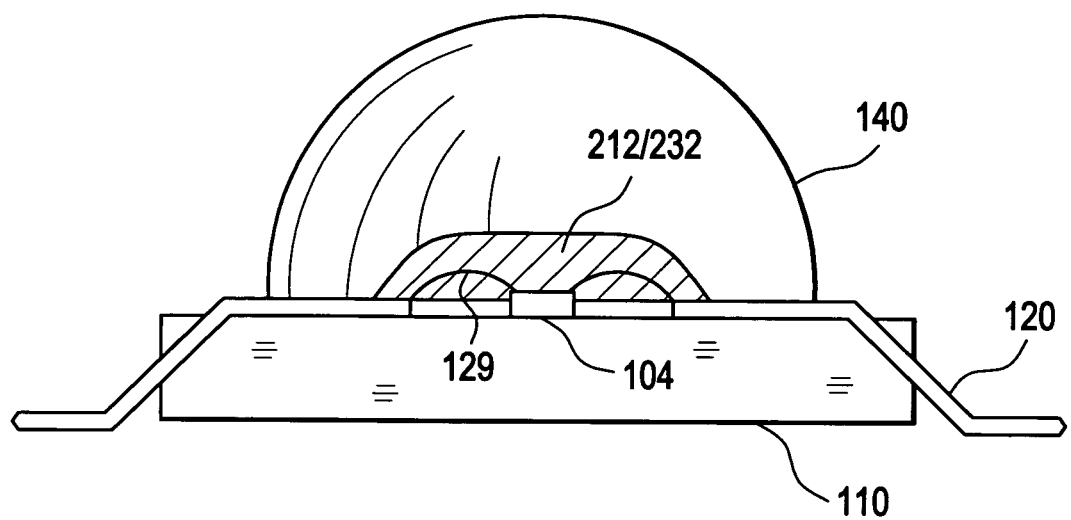
FIGS. 14A and 14B illustrates a side view of a LED package to illustrate a lens variation applicable to FIGS. 8 and 10, according to another exemplary embodiment of the present invention.
Figure 14B:
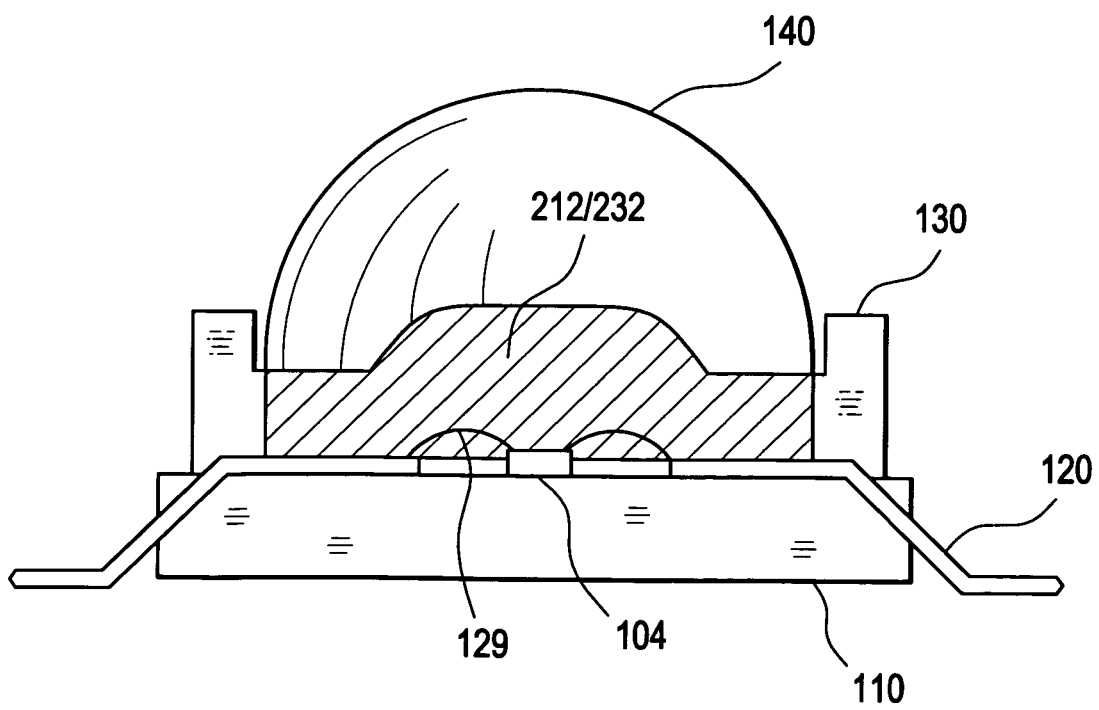

The example embodiments of the present invention being thus described, it will be obvious that the same may be varied in many ways. For example, lens 140 may be differently configured than as illustrated in FIGS. 8 and 10. FIGS. 14A and 14B illustrate a side view of a LED package to illustrate a lens variation applicable to FIGS. 8 and 10, according to another exemplary embodiment of the present invention. As shown in FIGS. 14A and 14B, there is shown a pre-molded lens 140 that is placed over the LED die 104, with encapsulant 212/232 used between lens 140 and die 104.

In another example, the flextape 120 may be embodied other than as a polyimide polymer film. In one example, the application of a polyimide such as PYROLUX.RTM. by Dupont may be sprayed on a metal substrate of a suitable thickness, (such as 2 um thick). A leadframe such as copper (Cu) may be used for the metal traces and die attach platform. The top of the flextape could be insulated or not depending on needs/desires of the application or LED. Additionally, the polyimide could be etched as desired into a "flex-print" type lead configuration and applied to a heat sink.

Such variations are not to be regarded as departure from the spirit and scope of the exemplary embodiments of the present invention, and all such modifications as would be obvious to one skilled in the art are intended to be included within the scope of the following claims.

What is claimed is:

1. A light emitting diode (LED) package, comprising:
   a rigid base having a first surface and at least one chamfered edge,
   at least one light emitting die directly disposed on the first surface of the rigid base, and
   a flextape disposed on the first surface of the rigid base and bent at an angle along the at least one chamfered edge, the flextape comprising at least one metal trace disposed within a flexible plastic resin such that the flextape comprises at least a first layer of the flexible plastic resin with the metal trace positioned on the first layer, and a second layer of the flexible plastic resin positioned on the at least one metal trace, the at least one metal trace being connected to the light emitting die, and the package being adapted to provide a thermal conduction and electrical isolation function for the light emitting die therein.

2. The package of claim 1, further comprising an encapsulant encapsulating the light emitting die and forming a lens of the package.

3. The package of claim 2, wherein the encapsulant has a hard outer surface and a core that is softer than the outer surface.

4. The package of claim 1, further comprising:
a lens on the base.

5. The package of claim 1, further comprising a retaining ring on the flextape and encompassing the light emitting die.

6. The package of claim 5, further comprising encapsulant encapsulating the light emitting die and at least partially filling a space above the light emitting die that is encircled by the retaining ring.

7. The package of claim 6, wherein said encapsulant has a generally semi-spherical hard, outer top surface and a softer core encapsulating the light emitting die.

8. The package of claim 1, wherein the flextape includes a polyimide layer, and a conductive layer forming at least one metal trace.

9. The package of claim 1, wherein each of the first and second layers of the flexible plastic resin comprise polyimide.

10. The package of claim 1, wherein the first surface is substantially planar.

11. A light emitting diode (LED) package, comprising:
a heat sinking base having a first surface and at least one chamfered edge,
at least one light emitting die directly disposed on the first surface of the heat sinking base, and
a flextape disposed on the first surface of the heat sinking base and bent at an angle along the at least one chamfered edge, the flextape comprising at least one metal trace within a flexible plastic resin such that the flextape comprises at least a first layer of the flexible plastic resin with the metal trace positioned on the first layer of the flexible plastic resin, and a second layer of the flexible plastic resin positioned on the at least one metal trace, the at least one metal trace connected to the light emitting die, and the package being adapted to provide a thermal conduction and electrical isolation function for the light emitting die therein.

12. The package of claim 11, wherein the heating sinking base includes a basin with the first surface extending into the basin, the at least one light emitting die being placed within the basin.

13. The package of claim 11, further comprising an encapsulant encapsulating the light emitting die and forming a lens of the package.

14. The package of claim 11, wherein the first surface is substantially planar.

15. The package of claim 11, wherein each of the first and second layers of the flexible plastic resin comprise polyimide.

16. A light emitting diode (LED) package, comprising:
a base having one or more inclined surfaces;
at least one light emitting die provided on a portion of the base, and
a flextape provided directly on a portion of the base;
wherein the flextape comprises a conductive layer between two layers of flexible plastic resin, the conductive layer configured for electrically communicating with the at least one light emitting die, and wherein the flextape is adapted to attach to the one or more inclined surfaces of the base.

17. The LED package of claim 16, wherein the conductive layer comprises a flexible metal lead disposed between the two layers of flexible plastic resin.

18. The LED package of claim 17, wherein the flextape extends outwardly from the package.

* * * * *